(12) United States Patent
Ogden et al.

(10) Patent No.: US 8,912,829 B1
(45) Date of Patent: Dec. 16, 2014

(54) METHOD AND APPARATUS FOR USING A SYNCHRONOUS RESET PULSE TO RESET CIRCUITRY IN MULTIPLE CLOCK DOMAINS

(71) Applicant: Xilinx, Inc., San Jose, CA (US)

(72) Inventors: James E. Ogden, Tracy, CA (US);
James M. Simkins, Park City, UT (US);
Uma Durairajan, Sunnyvale, CA (US);
Subodh Kumar, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 13/965,021

(22) Filed: Aug. 12, 2013

(51) Int. Cl.
*H03L 7/00* (2006.01)
*H03L 7/10* (2006.01)
*H03K 17/22* (2006.01)
*H02M 1/00* (2006.01)

(52) U.S. Cl.
CPC .............. *H03L 7/105* (2013.01); *H03K 17/223* (2013.01); *H02M 2001/0032* (2013.01)

USPC ............................ 327/143; 327/142; 327/198

(58) Field of Classification Search
CPC . H03K 7/105; H03K 17/223; H03K 3/30375; H02M 2001/0032
USPC .......................... 327/142, 143, 198
See application file for complete search history.

(56) References Cited

U.S. PATENT DOCUMENTS

| | | | | |
|---|---|---|---|---|
| 5,315,183 | A * | 5/1994 | Ruotsalainen | 327/3 |
| 7,084,679 | B2 * | 8/2006 | Hartfiel et al. | 327/141 |
| 7,098,706 | B1 * | 8/2006 | Pasqualini | 327/141 |

* cited by examiner

*Primary Examiner* — John Poos
(74) *Attorney, Agent, or Firm* — Kin-Wah Tong

(57) ABSTRACT

An integrated circuit and method for using a synchronous reset pulse to reset a circuitry comprising a plurality of clock domains are disclosed. For example, the method of the present disclosure provides a reset signal that is synched to one clock, takes the synchronous signal and resets circuits in a plurality of clock domains. In order to reset a portion of the circuit which is in a particular clock domain, the reset needs to be synchronized to the clock of the particular domain.

20 Claims, 6 Drawing Sheets

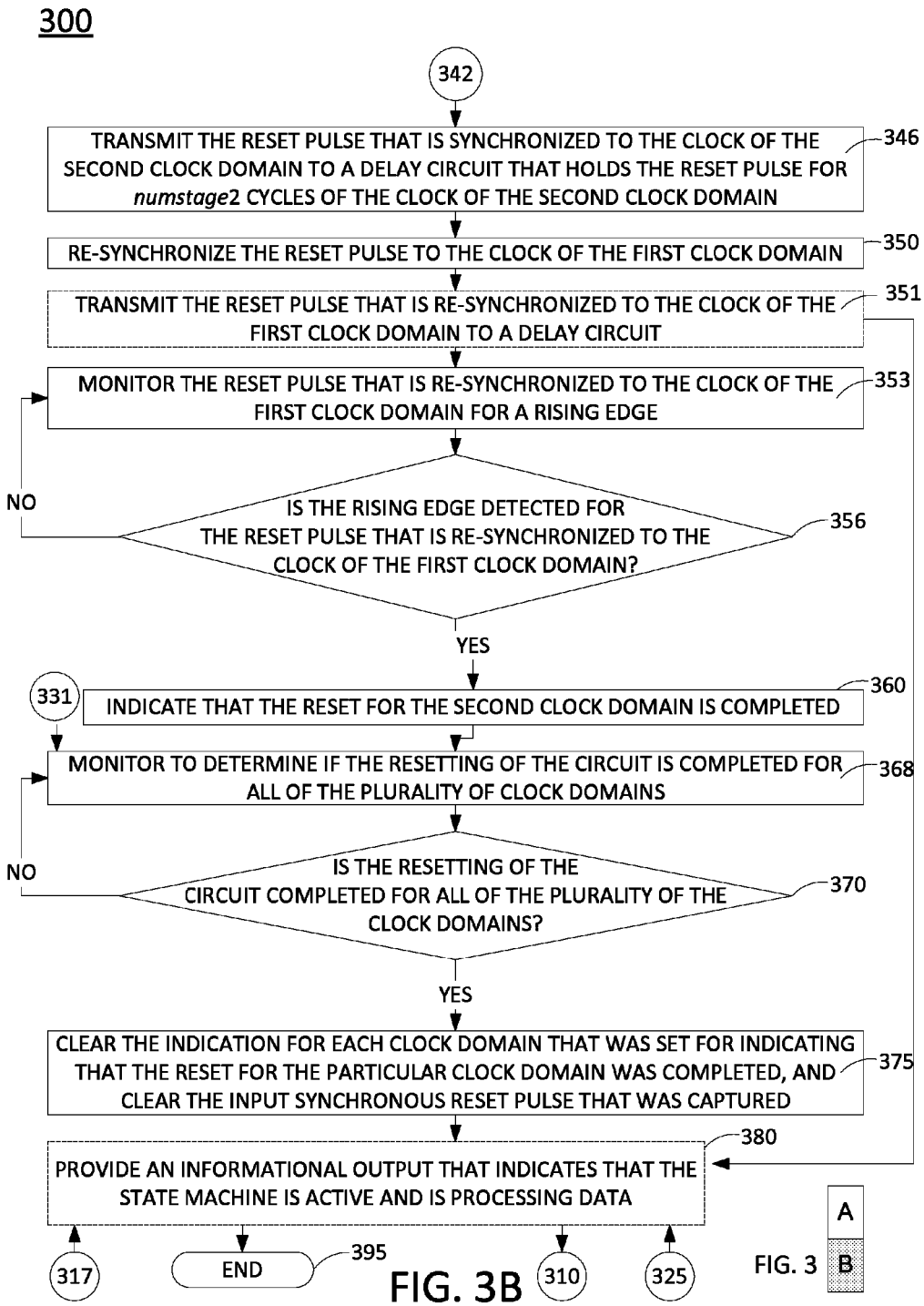

METHOD AND APPARATUS FOR USING A SYNCHRONOUS RESET PULSE TO RESET CIRCUITRY IN MULTIPLE CLOCK DOMAINS

FIELD OF THE INVENTION

The present disclosure relates generally to integrated circuits and more particularly, to the resetting of the circuitry of the integrated circuit having a plurality of clock domains.

BACKGROUND OF THE INVENTION

A reset is an operation used to force a system of chips comprising circuitry into a stable and known state. In order to reset a circuitry in a plurality of clock domains, an asynchronous reset pulse may be transmitted to each of the plurality of clock domains. The reset pulse is then synchronized to a clock of each of the plurality of clock domains before being used for resetting the circuitry in a respective clock domain.

The reset pulse in each particular clock domain may be held for several clock cycles for all circuitry in the particular clock domain to be reset. The resetting of a circuitry in a particular clock domain is independent of a resetting of a circuitry in another clock domain. Since the clock frequencies and the number of clock cycles needed for resetting circuitry for each clock domain are independent of those for another clock domain, determining which particular circuitry has completed the resetting first is difficult.

Moreover, when driving an asynchronous reset to a plurality of clock domains, the reset pulse may not meet recovery and removal timing requirements in one or more clock domains on either a rising edge or a falling edge of the asynchronous signal. Recovery time refers to a time between, when the reset is released (de-asserted) and a time when the clock signal is active (becomes high). Removal time refers to a time between, when the clock signal is active (becomes high) and the time when the reset is released (de-asserted). For example, the time requirements in a clock domain may not be satisfied if an asynchronous reset is released near an active edge of a flip-flop such that the output of the flip-flop becomes meta-stable. Failing to meet the timing requirement may result in the resetting operation for the particular domain being lost. An external logic may need to be aware of whether a resetting operation for a clock domain has concluded successfully. In addition, the external logic may need to know whether the reset operation has concluded for all the circuitry in the plurality of clock domains.

SUMMARY OF THE INVENTION

The present disclosure provides a method for using an input synchronous reset pulse to reset a circuitry comprising a plurality of clock domains. The method captures the input synchronous reset pulse for resetting a circuitry comprising a plurality of clock domains, wherein the input synchronous reset pulse is synchronized to a clock of a first clock domain of the plurality of clock domains, holds the input synchronous reset pulse that is captured, generates a reset pulse for the first clock domain, transmits the reset pulse that is generated to a logic in the first clock domain, transmits the reset pulse that is generated to a delay circuit that holds the reset pulse for a first number of cycles of the clock of the first clock domain, monitors for a rising edge of the reset pulse that has been held for the first number of cycles of the clock of the first domain, indicates that the reset for the first clock domain is completed, when the rising edge of the reset pulse is detected, transmits the reset pulse that is generated to a synchronizer of a second clock domain, synchronizes the reset pulse that is transmitted from the first clock domain to a clock of the second clock domain, transmits the reset pulse that is synchronized to the clock of the second clock domain to a logic in the second clock domain, transmits the reset pulse that is synchronized to the clock of the second clock domain to a delay circuit that holds the reset pulse for a second number of cycles of the clock of the second clock domain, re-synchronizes the reset pulse that is synchronized to the clock of the second clock domain back to the clock of the first clock domain, monitors the reset pulse that is re-synchronized to the clock of the first clock domain for a rising edge, indicates that a reset for the second clock domain is completed, when the rising edge is detected for the reset pulse that is re-synchronized to the clock of the first clock domain, determines if a resetting of the circuitry is completed for all of the plurality of the clock domains, and clears the input synchronous reset pulse that was captured, when the resetting of the circuitry is completed for all of the plurality of the clock domains.

In various embodiments: further comprising providing an informational output that indicates that a state machine is active and is processing data; the synchronous reset pulse is generated from an asynchronous reset pulse; the synchronous reset pulse is generated from the asynchronous reset pulse by capturing the asynchronous reset pulse and passing the asynchronous reset pulse through a synchronizer, further comprising providing an indication in the first clock domain that indicates that a reset is in progress for the first clock domain; a value of the first number of cycles is set to a minimum number of cycles of the first clock that the reset signal is guaranteed to be held before being cleared, further comprising providing an indication in the second clock domain that indicates that a reset is in progress for the second clock domain; the value of the second number of cycles is set to a minimum number of cycles of the second clock that the reset signal is guaranteed to be held before being cleared; further comprising transmitting the reset pulse that is re-synchronized to the clock of the first clock domain to a delay circuit.

The present disclosure provides a non-transitory computer-readable medium storing a plurality of instructions which, when executed by a processor, cause the processor to perform operations for using an input synchronous reset pulse. The operations comprising: capturing the input synchronous reset pulse for resetting a circuitry comprising a plurality of clock domains, wherein the input synchronous reset pulse is synchronized to a clock of a first clock domain of the plurality of clock domains, holding the input synchronous reset pulse that is captured, generating a reset pulse for the first clock domain, transmitting the reset pulse that is generated to a logic in the first clock domain, transmitting the reset pulse that is generated to a delay circuit that holds the reset pulse for a first number of cycles of the clock of the first clock domain, monitoring for a rising edge of the reset pulse that has been held for the first number of cycles of the clock of the first domain, indicating that the reset for the first clock domain is completed, when the rising edge of the reset pulse is detected, transmitting the reset pulse that is generated to a synchronizer of a second clock domain, synchronizing the reset pulse that is transmitted from the first clock domain to a clock of the second clock domain, transmitting the reset pulse that is synchronized to the clock of the second clock domain to a logic in the second clock domain, transmitting the reset pulse that is synchronized to the clock of the second clock domain to a delay circuit that holds the reset pulse for a second number of cycles of the clock of the second clock domain, re-synchronizing the reset pulse that is synchronized to the clock of the second clock domain back to the clock of the first clock domain, monitoring the reset pulse that is re-synchronized to the clock of the first clock domain for a rising edge, indicating that a reset for the second clock domain is completed, when the rising edge is detected for the reset pulse that is re-synchronized to the clock of the first clock domain, determining if a resetting of the circuitry is completed for all of the plurality of the clock domains, and clearing the input synchronous reset pulse that was captured, when the resetting of the circuitry is completed for all of the plurality of the clock domains.

The present disclosure provides an integrated circuit, comprising: a signal capturing module for capturing a synchronous reset pulse for resetting a circuitry comprising a plurality of clock domains, wherein the synchronous reset pulse is synchronized to a clock of a first clock domain of the plurality of clock domains, and for generating a reset pulse for the first clock domain to be transmitted to a logic in the first clock domain and to a delay circuit that holds the reset pulse for a first number of cycles of the clock of the first clock domain, a first monitoring module for monitoring a rising edge of the reset pulse that has been held for the first number of cycles of the clock of the first domain, and for indicating that the reset for the first clock domain is completed, when the rising edge of the reset pulse is detected, a first synchronizer for synchronizing the reset pulse that is transmitted from the first clock domain to a clock of the second clock domain, wherein the reset pulse that is synchronized to the clock of the second clock domain is transmitted to a logic in the second clock domain and to a delay circuit that holds the reset pulse for a second number of cycles of the clock of the second clock domain, a second synchronizer for re-synchronizing the reset pulse that is synchronized to the clock of the second clock domain back to the clock of the first clock domain, a second monitoring module for monitoring the reset pulse that is re-synchronized to the clock of the first clock domain for a rising edge, and for indicating that a reset for the second clock domain is completed, when the rising edge is detected for the reset pulse that is re-synchronized to the clock of the first clock domain, and a logic gate for determining if a resetting of the circuitry is completed for all of the plurality of the clock domains.

BRIEF DESCRIPTION OF THE DRAWINGS

Accompanying drawings show exemplary examples in accordance with one or more aspects of the disclosure; however, the accompanying drawings should not be taken to limit the disclosure to the examples shown, but are for explanation and understanding only.

To facilitate understanding, identical reference numerals have been used, where possible, to designate identical elements that are common to the figures.

DETAILED DESCRIPTION OF THE DRAWINGS

Figure 1:
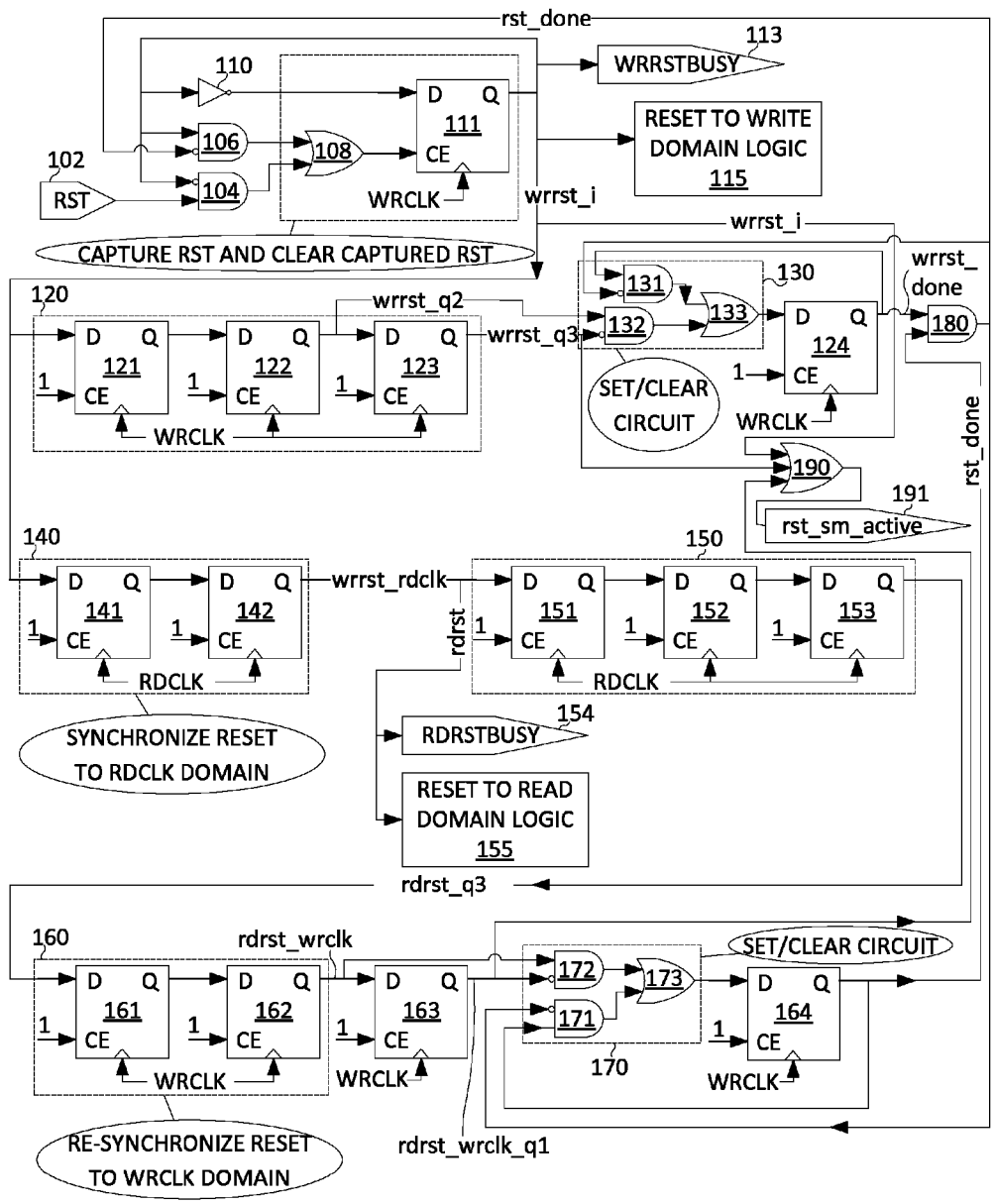
FIG. 1 illustrates a circuit that uses a synchronous reset pulse to reset its circuitry in a plurality of clock domains.

The present disclosure provides a method and circuit for using a synchronous reset pulse to reset circuitry in a plurality of clock domains. The method of the present disclosure provides a reset signal that is synched to one clock, takes the synchronous signal and resets circuits in a plurality of clock domains. In order to reset a portion of the circuit which is in a particular clock domain, the reset needs to be synchronized to the clock of the particular domain. Thus, even though the reset pulse was originally synchronous only to the clock of the first clock domain, it will be synchronized with a clock of each particular domain before being used for resetting circuits in the particular domain. In order to ensure that the reset is performed properly and the resulting state is stable, the assertion and de-assertion of the reset is coordinated across the plurality of clock domains. For example, circuits are released to resume their normal operation only after the reset is completed in all of the plurality of clock domains.

For example, a user may initiate the reset via a user interface. The method captures an input synchronous reset pulse that is synchronized to a clock of a first clock domain of the plurality of clock domains (e.g., two or more clock domains). The synchronous reset pulse has a width of at least one clock cycle of the clock of the first clock domain. For example, a flip-flop may be used for the capturing of the input synchronous reset pulse. The flip-flop may also be referred to as a flop. The input pulse needs to meet setup and hold time requirements of a first flop.

The method holds the input synchronous reset pulse that is captured until the reset operation is completed for all of the plurality of clock domains. While the input synchronous reset pulse that is captured is being held, subsequent input synchronous reset pulses are ignored.

The method then generates a reset pulse for the first clock domain. In one example, the method provides an indicator in the first clock domain that indicates that a reset is in progress for the first clock domain.

The method holds the reset pulse that is generated for the first clock domain for numstage1 cycles of the clock of the first clock domain. The value of numstage1 is set to a minimum number of cycles of the first clock that the reset signal is guaranteed to be held asserted (high) before being cleared. In one example, the reset signal is held asserted for numstage1 cycles of the first clock by using a shift-register to create a second reset signal, wherein the second reset signal is derived by delaying the reset signal by numstage1 cycles of the first clock. The minimum duration of a reset sequence for the first domain is then the duration of the numstage1 cycles of the shift-register.

The method monitors for a rising edge of the reset pulse that has been held for numstage1 cycles of the clock of the first domain. If the rising edge is detected, the method indicates that the reset for the first clock domain is completed. For example, a flop may be set to indicate that the reset for the first clock domain is completed.

The method transmits the reset pulse that is generated for the first clock domain to another clock domain of the plurality of clock domains. For example, the method may transmit the reset pulse that is generated for the first clock domain to a second clock domain.

The method then synchronizes, to a clock of the second clock domain, via the reset pulse that is transmitted from the first clock domain. For example, the reset pulse that is transmitted to second clock domain passes through a synchronizer in the second clock domain. In one example, the method provides an indicator in the second clock domain that indicates that a reset is in progress for the second clock domain.

The method holds the reset pulse that is synchronized to the clock of the second clock domain for numstage2 cycles of the clock of the second clock domain. For the example above, the method holds the reset pulse that is synchronized to the clock of the second clock domain for numstage2 cycles of the clock of the second clock domain.

The method then re-synchronizes the reset pulse to the clock of the first clock domain. For example, the reset pulse that has been held for numstage2 cycles passes through a synchronizer in the first clock domain.

The method monitors for a rising edge of the reset pulse that has been resynchronized to the clock of the first clock domain. If the rising edge is detected, the method indicates that the reset for the second clock domain is completed. For example, a flop may be set to indicate that the reset for the second clock domain is completed.

The method then determines when the reset operation is completed for all of the plurality of the clock domains (e.g., two or more clock domains). For example, the method may use an AND logic gate. Each output that indicates that a reset is completed for a particular clock domain is input into the AND gate. The output of the AND gate may then be set to high (a value of one) when the reset is completed for all of the plurality of clock domains.

The method then clears the indication for each clock domain that was set for indicating that the reset for the particular clock domain was completed. The method also clears the input synchronous reset pulse that was captured.

In the next cycle of the first clock domain, the indicator in the first clock domain that previously indicated that a reset was in progress will be cleared. The reset pulse for the first clock domain is also de-asserted. Once the de-assertion of the reset pulse propagates to any other clock domain, the indicator that previously indicated that a reset was in progress in the respective clock domain will also be cleared.

In one example, the method provides an informational output that indicates that the state machine is active and is processing data. When the state machine is not active, all flops are set to a value of zero (low). In one example, when the state machine is not active, the informational output may be used to disable the clocks in the plurality of clock domains.

FIG. 1 illustrates a circuit 100 (and associated method) for using a synchronous reset pulse to reset a two clock domain circuitry, wherein a first clock domain comprises a write clock domain and a second clock domain comprises a read clock domain. The circuit 100 in FIG. 1 is only illustrative and should not be interpreted as a limitation of the present disclosure.

A user may initiate an input synchronous reset pulse 102 via a user interface. The input synchronous reset pulse 102 is synchronized to the clock of the write clock domain (broadly a first clock domain), has a width of at least one clock cycle of the clock of the write clock domain, and meets the setup and hold time requirements of a flip-flop 111. The circuit captures the input synchronous reset pulse 102. For example, the flip-flop 111 may be used for capturing of the input synchronous reset pulse 102.

The circuit holds the input synchronous reset pulse that is captured until the reset operation is completed for both the write clock domain and read clock domain (broadly a second clock domain). While the input synchronous reset pulse that is captured is being held, subsequent input synchronous reset pulses are ignored. A circuit comprising gates 104, 106 and 108 is connected to a clock enable (CE) input of the flip-flop 111 (broadly a signal capturing module or circuit) to hold the input synchronous reset pulse until the reset operation is completed for both clock domains and to effect ignoring of subsequent input synchronous reset pulses from a user until the reset from the previous input is completed. An indication for indicating that the reset operation is done (e.g., rst_done) is received by gate 106 when the reset operation is completed. The logic from inverter 110 and AND gate 106, together cause flop 111 to clear.

The circuit then generates a reset pulse for the write clock domain. The reset pulse that is generated is indicated in FIG. 1 as wrrst_i and is used for a plurality of operations. When the reset pulse wrrst_i is generated, the circuit performs one or more of the following:

(1) The circuit provides an indicator in the write clock domain that indicates that a reset is in progress for the write clock domain. For example, the method may provide an indicator 113 WRRSTBUSY (via a logic element) that indicates that a reset is in progress for the write clock domain. The indicator may be used to prevent a user from being able to perform a write operation during a reset in the write domain.

(2) The circuit transmits the reset pulse that is generated to various logic in the write clock domain. For example, the circuit transmits the reset pulse (wrrst_i) to various logic 115 in the write clock domain.

(3) The circuit transmits the reset pulse that is generated to the logic gate 190. The logic gate 190 is used to provide an informational output via an indicator 191 (e.g., rst_sm_active) that indicates that the circuit is still processing data. The indication provided via the indicator 191 may be used to select the source clock(s) for the write and read clock domains.

(4) The circuit transmits the reset pulse, wrrst_i, that is generated to a delay circuit 120. The circuit 120 holds the wrrst_i pulse for numstage1 cycles (broadly a number of cycles) of the clock of the write domain. The value of numstage1 is set to a minimum number of cycles of the write clock that the reset signal is guaranteed to be held high before being cleared (i.e., the number of stages depends on a number of stages required for the WRCLK domain to reset). For the illustrative circuit of FIG. 1, numstage1-3 only as an example, and flops 121-123 are used to hold the wrrst_i for 3 cycles of the write clock. For example, a reset pulse wrrst_q3, shown in FIG. 1, is a delayed version of the wrrst_i pulse, wherein the wrrst_q3 is delayed by 3 cycles of the clock of the write domain. The circuit monitors for a rising edge of the wrrst_q3 pulse via a first monitoring module or circuit 130 and flop 124. The monitoring circuit 130 comprises logic gates 131-133 that are used for detecting the rising edge of the wrrst_q3 pulse, setting the flop 124 to high (value of one) when the rising edge is detected for the wrrst_q3 pulse, and holding the flop 124 set to high until the reset operation is completed for both the write and read clock domains. The wrclk_q3 pulse is also transmitted to gate 190.

(5) The circuit transmits the reset pulse that is generated to the read clock domain. For example, the circuit transmits the wrrst_i pulse to synchronizer circuit 140 of the read domain. The synchronizer circuit 140 comprises flops 141 and 142. The wrrst_i pulse passes through flops 141 and 142 and the resulting pulse is synchronized to the clock of the read domain. In FIG. 1, the pulse that is now synchronized to the clock of the read domain is a reset pulse for the read clock domain. The reset pulse for the read clock domain that is derived by synchronizing the wrrst_i pulse to the read clock is designated as wrrst_rdclk and is used for a plurality of operations.

The reset pulse wrrst_rdclk is used to perform one or more of the following:

(a) The circuit provides an indicator in the read clock domain that indicates that a reset is in progress for the read clock domain. For example, the circuit may provide an indicator 154 RDRSTBUSY via a logic element that indicates that a reset is in progress for the read clock domain. The indicator may be used to prevent a user from being able to perform a read operation during a reset in the read domain.

(b) The circuit transmits the reset pulse that is synchronized to the read clock to various logic in the read clock domain. For example, the circuit transmits the wrrst_rdclk pulse to logic 155 in the read clock domain.

(c) The circuit transmits the reset pulse, wrrst_rdclk, that is synchronized to the read clock to a delay circuit 150. The circuit 150 holds the wrrst_rdclk pulse for numstage2 cycles (broadly a number of cycles) of the clock of the read domain. The value of numstage2 is set to a minimum number of cycles of the read clock that the reset signal is guaranteed to be held high before being cleared (i.e., the number of stages depends on a number of stages required for the RDCLK domain to reset). For the illustrative circuit of FIG. 1, numstage2=3 only as an example, and flops 151-153 are used to hold the wrrst_rdclk for 3 cycles of the clock of the read domain. For example, a reset pulse rdrst_q3, shown in FIG. 1, is a delayed version of the wrrst_rdclk pulse, wherein the rdrst_q3 pulse is delayed by 3 cycles of the clock of the read domain. The rdrst_q3 pulse is then sent to a synchronizer circuit 160. The synchronizer circuit 160 comprises flops 161 and 162. The rdrst_q3 pulse passes through flops 161 and 162 and the resulting pulse is synchronized to the clock of the write domain. The pulse that is derived by synchronizing the rdrst_q3 pulse to the write clock is designated by rdrst_wrclk. Flop 163 is used to hold the rdrst_wrclk pulse for one cycle of the clock of the write domain. In FIG. 1, the pulse derived by holding the rdrst_wrclk pulse for one cycle of the clock of the write domain is denoted by rdrst_wrclk_q1.

The circuit monitors for a rising edge of the rdrst_wrclk_q1 via a second monitoring module or circuit 170 and a flop 164. The circuit 170 comprises logic gates 171-173 that are used for detecting the rising edge of the rdrst_wrclk_q1 pulse, setting the flop 164 to high (value of one) when the rising edge is detected for rdrst_wrclk_q1, and holding the flop 164 set to high until the reset operation is completed for both write and read clock domains. The rdrst_wrclk_q1 pulse is also transmitted to gate 190.

The circuit then determines when the reset operation is completed for both clock domains. The logic gate 180 is set to high to indicate that a reset is completed for both (e.g., via wrrst_done and rdrst_done) the write and read clock domains. The output, rst_done, of gate 180 is used to clear the indications that were set for indicating that the reset for the particular clock domain was completed. The circuit also clears the input synchronous reset pulse that was captured. In the next cycle of the write clock domain, the indicator in the first clock domain that previously indicated that a reset was in progress will be cleared. The reset pulse for the write clock domain is also de-asserted. Once the de-assertion of the reset pulse propagates to the read clock domain, the indicator that previously indicated that a reset was in progress in the read clock domain will be cleared.

In one example, the circuit of the present disclosure for using a synchronous reset pulse to reset circuitry in a plurality of clock domains is used to reset circuitry for a First-In First-Out (FIFO) buffer that operates in multiple clock domains. For example, the FIFO buffer may comprise a write domain logic circuitry in a first clock domain, and a read domain logic circuitry in a second clock domain. The first and second clock domains may also be referred to as a write clock domain and a read clock domain, respectively.

Figure 5:
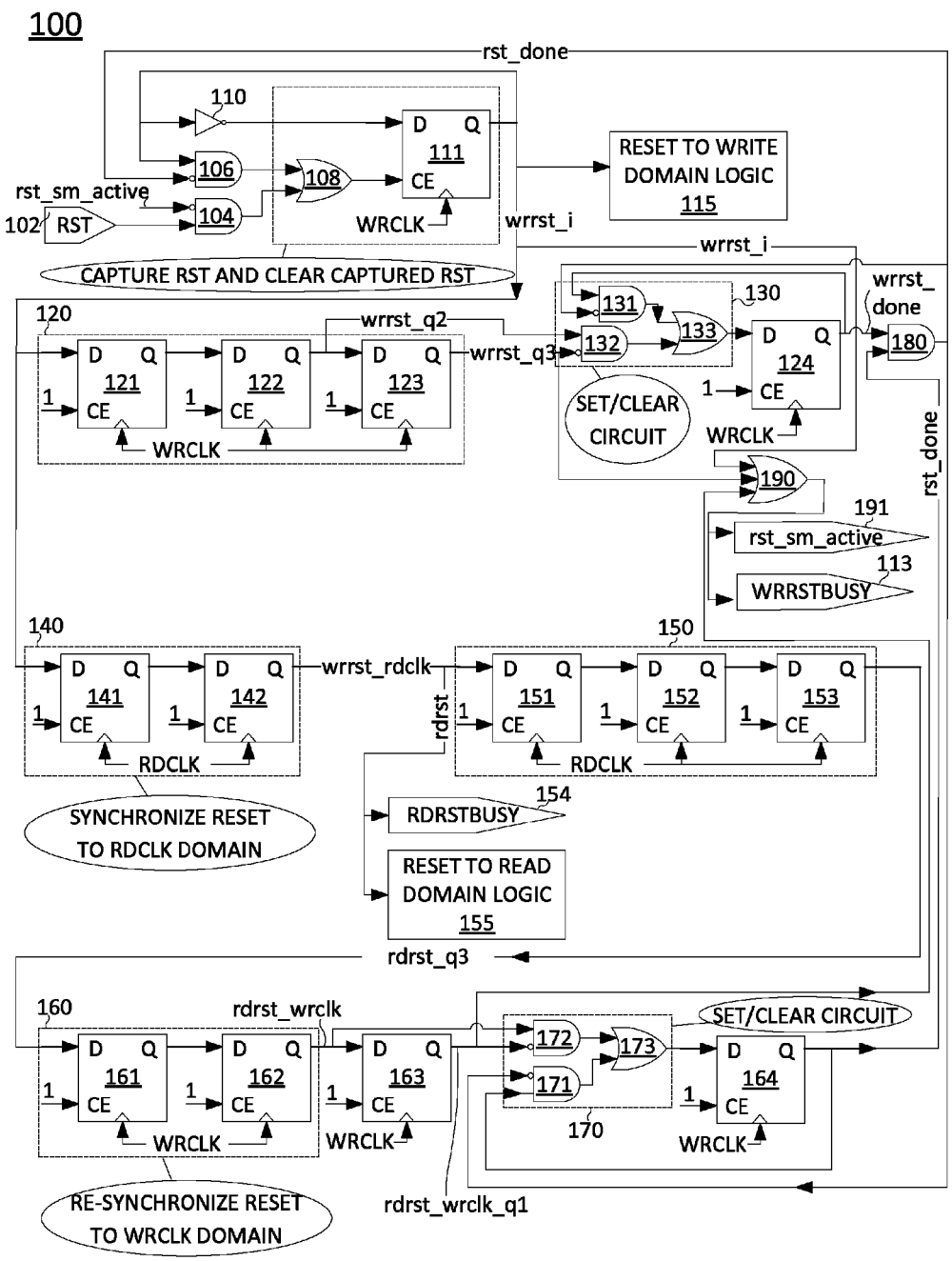
FIG. 5 illustrates an alternative circuit that uses a synchronous reset pulse to reset its circuitry in a plurality of clock domains.

FIG. 5 illustrates an alternative circuit that is similar to FIG. 1. The entire circuit of FIG. 5 is identical to FIG. 1 with the exception that the signal from gate 190 is also directly provided to a logic element to provide the indicator 113 WRRSTBUSY. As discussed above, the indicator 113 WRRSTBUSY indicates that a reset is in progress for the write clock domain. As such, the output of flop 111 of FIG. 5 will not be used to provide the indicator 113 WRRSTBUSY as previously shown in FIG. 1. Furthermore, AND gate 104 does not take wrrst_i as an input. Instead, input to AND gate 104 is based on RST 102 and either WRRSTBUSY 113 or rst_sm_active 191 as shown in FIG. 5.

Figure 2:
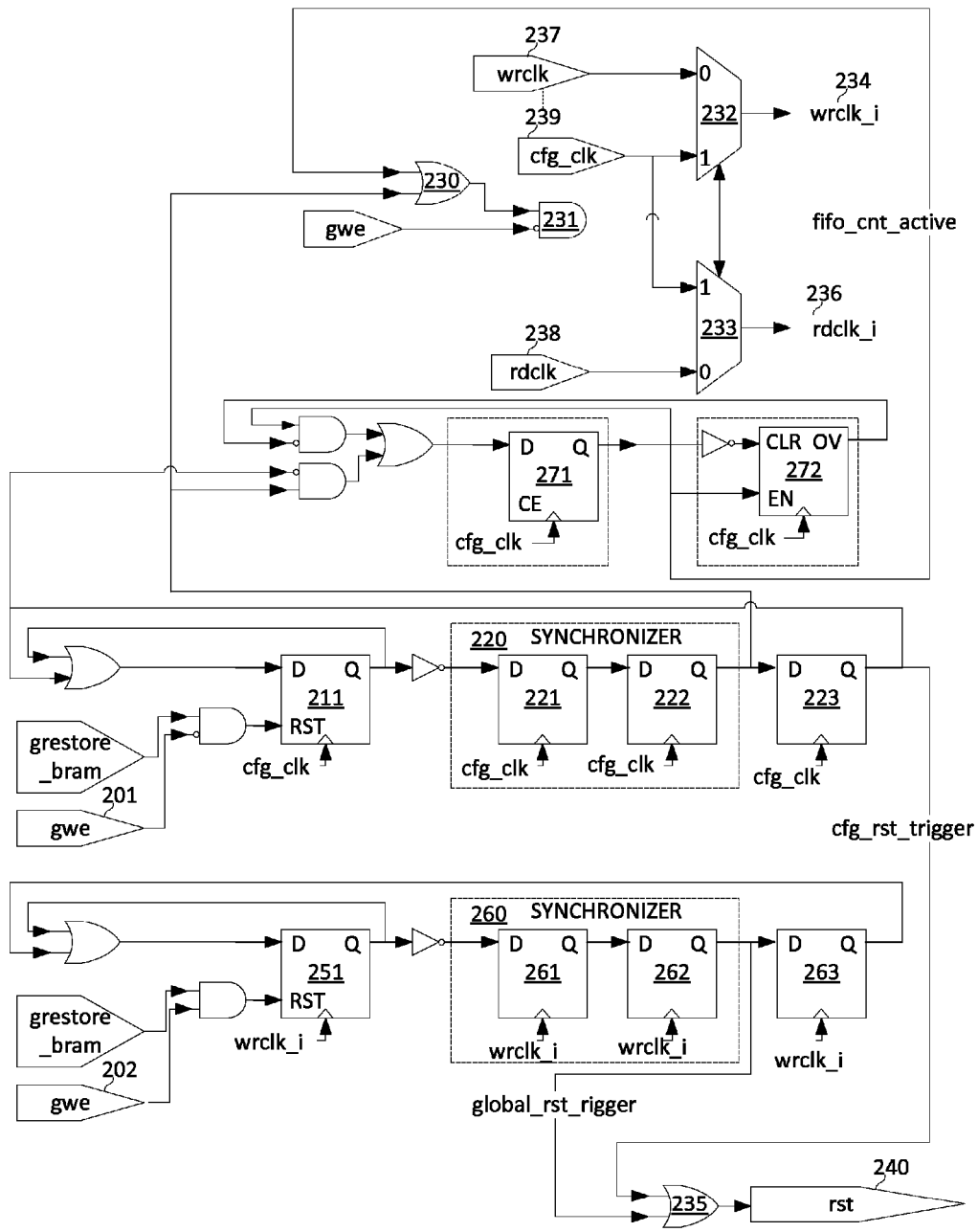
FIG. 2 illustrates a circuit that uses an asynchronous reset pulse to generate a synchronous reset pulse.

FIG. 2 illustrates a circuit 200 (broadly an asynchronous reset synchronizer and clock gating module or circuit) and associated method of using an asynchronous reset pulse to generate a synchronous reset pulse. The circuit 200 is implemented with the ability to switch between a configuration mode and a user mode. Under the configuration mode, a configuration clock (e.g., cfg_clk) will be used, whereas under the user mode, a user clock (e.g., wrclk or rdclk) will be used.

A user may initiate an input asynchronous reset pulse 201 relative to the configuration clock (when gwe=0), via a user interface or an input asynchronous reset pulse 202 relative to the user clock (when gwe=1). For example, the input asynchronous reset pulse 201 is captured via flop 211 and synchronized to the clock of the configuration clock domain via a synchronizer 220. The synchronizer 220 comprises flops 221-222 as an example. The output of flop 222 is a synchronous reset pulse that is synchronous with respect to the configuration clock. The synchronous reset pulse, cfg_rst_trigger, via OR logic 235 may then be provided as a synchronous reset trigger 240, rst, to the circuit of 100 described above.

Similarly, in one example, the input asynchronous reset pulse 202 is captured via flop 251 and synchronized to the clock of the user clock domain, e.g., wrclk_i via a synchronizer 260. The synchronizer 260 comprises flops 261-262 as an example. The output of flop 262 is a synchronous reset pulse that is synchronous with respect to the user clock. The synchronous reset pulse, global_rst_trigger, via OR logic 235 may then be provided as a synchronous reset trigger 240, rst, to the circuit of 100 described above. Thus, the circuit of FIG. 2 may optionally drive the synchronous reset input of FIG. 1. It should be noted that both the flops 223 and 263 are used to extend the pulse width of the synchronous reset pulse.

FIG. 2 also illustrates the use of a counter logic, e.g., flop 271 and counter 272 (e.g., a 5-bit counter shown as an example only) to count a number of clock cycles to ensure that the reset operation is completed before switching the clocks. More specifically, the counter has an overflow output signal that can be used to extend the pulse width to any specified number of clock cycles, with the purpose of guaranteeing that the internal clocks are being driven by the cfg_clk for as many clock cycles as necessary to complete the internal reset and to flush the reset circuitry before releasing the internal clocks. The asynchronous reset pulse 201 is provided as an input to an OR logic 230. The fifo_cnt_signal from the counter logic is also provided to the OR logic 230 as another input. The OR logic 230 and an AND logic 231 are used to derive the write clock 234 signal, wrclk_i and read clock 234 signal, rdclk_i. Specifically, write clock 234 signal, wrclk_i, may be derived via a multiplexer (mux) 232 with an input from a configuration clock 239, cfg_clk and a write clock input 237. Read clock 236 signal, rdclk_i, may be derived via a mux 233 with an input from the configuration clock 239 and a read clock input 238. The write clock and read clock may optionally be gated to allow for just enough clock cycles for resetting the circuit. The clock may then be disabled when a reset operation is not being performed.

Figure 3A:
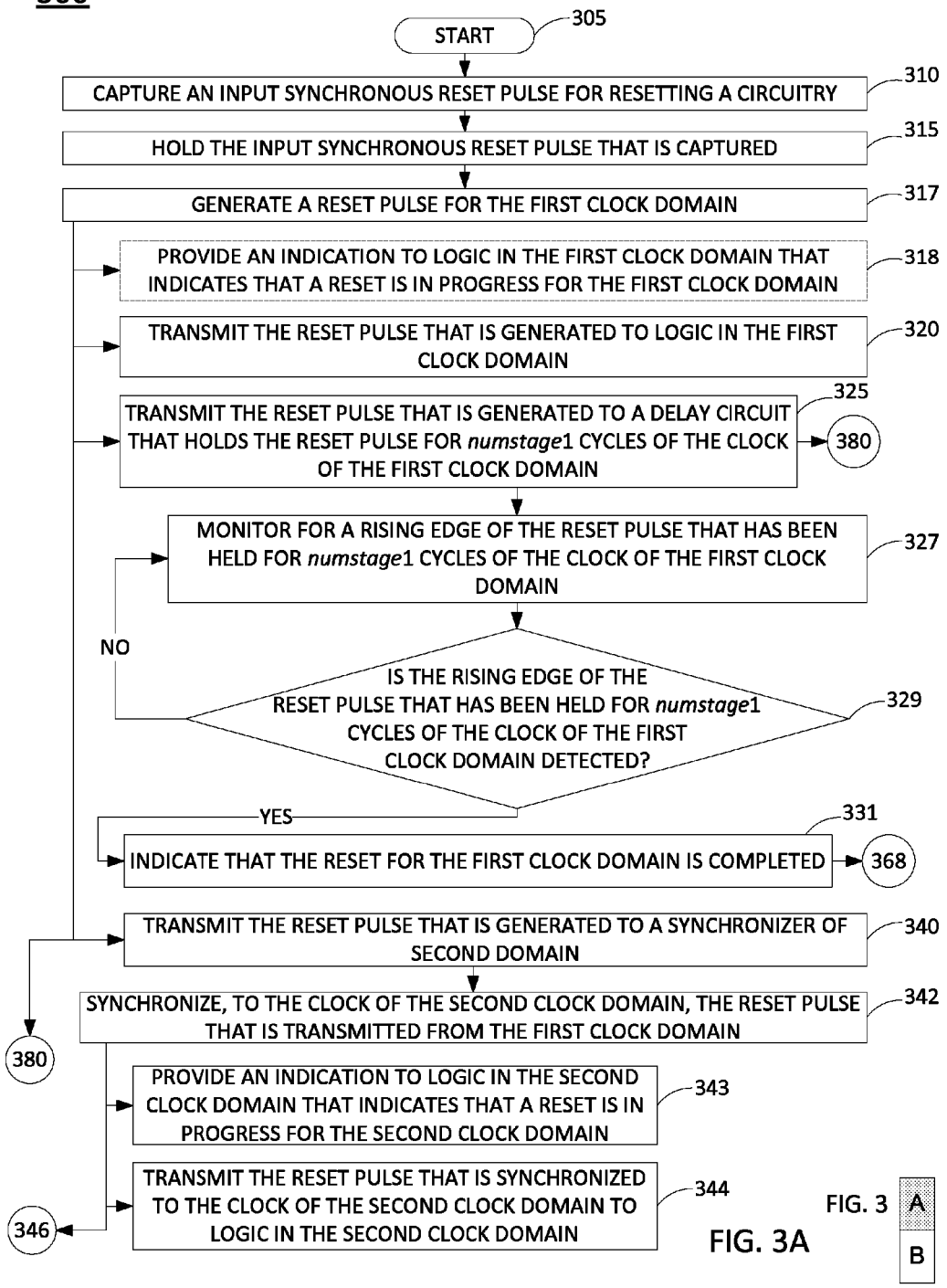
FIG. 3 (collectively shown as FIG. 3A and FIG. 3B) illustrates a flowchart of a method for using a synchronous reset pulse to reset circuitry in a plurality of clock domains.

FIG. 3 (collectively shown as FIG. 3A and FIG. 3B due to the size of the flowchart) illustrates a flowchart 300 of a method for using a synchronous reset pulse to reset circuitry in a plurality of clock domains. In one example, method 300 may be implemented in an integrated circuit (IC) chip, e.g., an Application Specific Integrated Circuit (ASIC), a programmable logic device (PLD) such as an Field Programmable Gate Array (FPGA) and the like. Method 300 starts in step 305 and proceeds to step 310.

In step 310, method 300 captures an input synchronous reset pulse for resetting a circuitry, wherein the input synchronous reset pulse is synchronized to a clock of a first clock domain of a plurality of clock domains. The synchronous reset pulse has a width of at least one clock cycle of the clock of the first clock domain.

In step 315, method 300 holds the input synchronous reset pulse that is captured. The input synchronous reset pulse is held until the resetting of the circuitry is completed for all of the plurality of clock domains. For example, for the circuit of FIG. 1, the method holds the input synchronous reset pulse by not clearing flop 111 set until the rst_done signal is received.

In step 317, method 300 generates a reset pulse for the first clock domain. For example, for the circuitry of FIG. 1, the method may generate the wrrst_i pulse. The method then proceeds to steps 318, 320, 325, 340 and 380. The steps 318, 320, 325, 340 and 380 may be performed in parallel or in series.

In optional step 318, method 300 provides an indication in the first clock domain that indicates that a reset is in progress for the first clock domain.

In step 320, method 300 transmits the reset pulse that is generated to various logic in the first clock domain. For example, for the circuit of FIG. 1, the method transmits the wrrst_i pulse to logic 115 in the write domain.

In step 325, method 300 transmits the reset pulse that is generated to a delay circuit that holds the reset pulse for numstage1 cycles of the clock of the first clock domain. The method then proceeds to steps 327 and 380.

In one example, the value of numstage1 is set to a minimum number of cycles of the first clock that the reset signal is guaranteed to be held before being cleared.

In step 327, method 300 monitors for a rising edge of the reset pulse that has been held for numstage1 cycles of the clock of the first domain.

In step 329, method 300 determines if the rising edge of the reset pulse that has been held for numstage1 cycles of the clock of the first domain is detected. If the rising edge is detected, the method proceeds to step 331. Otherwise, the method returns proceeds to step 327.

In step 331, method 300 indicates that the reset for the first clock domain is completed. For the above circuit, the flop 124 may be set to indicate that the reset for the first clock domain is completed. The method proceeds to step 368.

In step 340, method 300 transmits the reset pulse that is generated to a synchronizer of another domain (broadly a second domain). For example, for the circuit of FIG. 1, the method transmits the wrrst_i signal to the synchronizer 140 of the read domain.

In step 342, method 300 synchronizes, to the clock of the second clock domain, the reset pulse that is transmitted from the first clock domain. For example, for the circuit of FIG. 1, the method passes the wrrst_i pulse through the synchronizer 140 to obtain the wrrst_rdclk pulse, wherein the wrrst_rdclk pulse is synchronized to the read domain clock. The method then proceeds to steps 343, 344 and 346. The steps 343, 344 and 346 may be performed in parallel or in series.

In optional step 343, method 300 provides an indication in the second clock domain that indicates that a reset is in progress for the second clock domain. For example, for the circuit of FIG. 1, the method provides an indication to a read domain logic that indicates that a reset is in progress for the read domain.

In step 344, method 300 transmits the reset pulse that is synchronized to the clock of the second clock domain to logic in the second clock domain. For example, for the circuit of FIG. 1, the method sends the wrrst_rdclk pulse 155 to read domain logic.

In step 346, method 300 transmits the reset pulse that is synchronized to the clock of the another clock domain to a delay circuit that holds the reset pulse for numstage2 cycles of the clock of the another clock domain. For example, for the circuit of FIG. 1, the method transmits the wrrst_rdclk pulse to the delay circuit 150.

In one example, the value of numstage2 is set to a minimum number of cycles of the another clock that the reset signal is guaranteed to be held before being cleared.

In step 350, method 300 re-synchronizes the reset pulse to the clock of the first clock domain. For example, the reset pulse that has been held for numstage2 cycles passes through a synchronizer in the first clock domain.

In optional step 351, the method transmits the reset pulse that is re-synchronized to the clock of the first clock domain to a delay circuit. For example, for the circuit of FIG. 1, the method transmits the rdrst_wrclk pulse to the delay circuit that comprises the flop 163. The method then proceeds to steps 353 and 380.

In step 353, method 300 monitors the reset pulse that is re-synchronized to the clock of the first clock domain for a rising edge.

In step 356, method 300 determines if the rising edge is detected for the reset pulse that is re-synchronized to the clock of the first clock domain. If the rising edge is detected, the method proceeds to step 360. Otherwise, the method returns to step 353 to continue monitoring for the rising edge.

In step 360, method 300 indicates that the reset for the another clock domain is completed. For example, for the circuit of FIG. 1, the flop 164 may be set to indicate that the reset for the second clock domain is completed.

In step 368, method 300 monitors to determine if the resetting of the circuit is completed for all of the plurality of clock domains. For example, for the circuit of FIG. 1, the method may set the output of the gate 180 to high when the reset is completed for all of the plurality of clock domains.

In step 370, method 300 determines if the resetting of the circuit is completed for all of the plurality of the clock domains. If the resetting of the circuit is completed for all of the plurality of clock domains, the method proceeds to step 375. Otherwise, the method proceeds to step 368 to continue monitoring until the resetting is completed for all of the plurality of clock domains.

In step 375, method 300 clears the indication for each clock domain that was set for indicating that the reset for the particular clock domain was completed, and clears the input synchronous reset pulse that was captured, if the resetting of the circuit is completed for all of the plurality of the clock domains. The method then proceeds to step 380. In the next cycle of the first clock domain, the indicator in the first clock domain that previously indicated that a reset was in progress will be cleared. The reset pulse for the first clock domain is also de-asserted. Once the de-assertion of the reset pulse propagates to any other clock domain, the indicator that previously indicated that a reset was in progress in the respective clock domain will be cleared.

In optional step 380, method 300 provides an informational output that indicates that the state machine is active and is processing data. When the state machine is not active, all flops are set to a value of zero. The method then proceeds to either step 310 to capture another input synchronous reset pulse or to step 395 to end the process.

In one example, when the state machine is not active, the informational output is used to disable the clocks in the plurality of clock domains.

In one example, the input synchronous reset pulse is generated from an asynchronous reset pulse. For example, the method may use the circuit 200 to generate the synchronous reset pulse from an asynchronous reset pulse. In one example, the input synchronous reset pulse is generated from the asynchronous reset pulse by capturing the asynchronous reset pulse and passing the asynchronous reset pulse through a synchronizer.

It should be noted that although not specifically specified, one or more steps, operations, or blocks of method 300 may include a storing, displaying and/or outputting step as required for a particular application. In other words, any data, records, fields, and/or intermediate results discussed in the method can be stored, displayed and/or outputted to another device as required for a particular application. Furthermore, steps, operations, or blocks in FIG. 3 that recite a determining operation or involve a decision, do not necessarily require that both branches of the determining operation be practiced. In other words, one of the branches of the determining operation can be deemed as an optional step.

Figure 4:
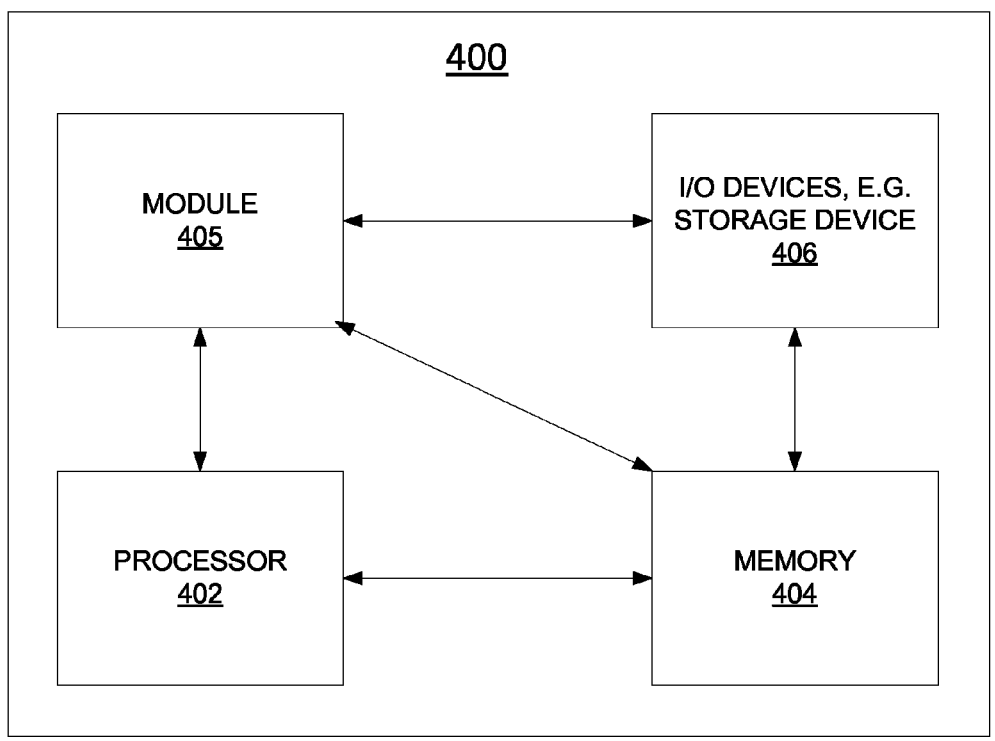
FIG. 4 depicts a high-level block diagram of a general-purpose computer suitable for use in performing the functions described herein.

FIG. 4 depicts a high-level block diagram of a general-purpose computer suitable for use in performing the functions described herein. As depicted in FIG. 4, the system 400 comprises a hardware processor element 402 (e.g., a CPU), a memory 404, e.g., random access memory (RAM) and/or read only memory (ROM), a module 405 for using a synchronous reset pulse to reset circuitry in a plurality of clock domains, and various input/output devices 406 (e.g., storage devices, including but not limited to, a tape drive, a floppy drive, a hard disk drive or a compact disk drive, a receiver, a transmitter, a speaker, a display, a speech synthesizer, an output port, and a user input device (such as a keyboard, a keypad, a mouse, and the like)).

It should be noted that the teachings of the present disclosure can be implemented in software and hardware, e.g., using application specific integrated circuits (ASIC), a general purpose computer or any other hardware equivalents, e.g., computer readable instructions pertaining to the method(s) discussed above can be used to configure a hardware processor to perform operations of the above disclosed methods. For example, a computer-readable medium may be in communication with the processor, where the computer-readable medium storing a plurality of instructions which, when executed by the hardware processor, cause the hardware processor to perform the operations (e.g., method 300) as disclosed above.

In one example, the present module or process 405 for using a synchronous reset pulse to reset circuitry in a plurality of clock domains can be loaded into memory 404 and executed by processor 402 to implement the functions as discussed above. As such, the present method 405 for using a synchronous reset pulse to reset circuitry in a plurality of clock domains (including associated data structures) of the present disclosure can be stored on a non-transitory (e.g., tangible or physical) computer readable medium, e.g., RAM memory, magnetic or optical drive or diskette and the like.

Examples of the present disclosure may also be implemented in whole or in part by a tunable IC, e.g., a PLD and/or FPGA. More specifically, a programmable logic device (PLD) is a general-purpose device that can be programmed by a user to implement a variety of selected functions. One type of PLD is a Field Programmable Gate Array (FPGA), which typically includes an array of configurable logic blocks (CLBs) and a plurality of input/output blocks (IOBs). The CLBs are individually programmable and can be configured to perform a variety of logic functions on a few input signals. The IOBs can be configured to drive output signals from the CLBs to external pins of the FPGA and/or to receive input signals from the external FPGA pins. The FPGA also includes a programmable interconnect structure that can be programmed to selectively route signals among the various CLBs and IOBs to produce more complex functions of many input signals. The CLBs, IOBs, and the programmable interconnect structure are programmed by loading configuration data into associated memory cells that control various switches and multiplexers within the CLBs, IOBs, and the interconnect structure to implement logic and routing functions specified by the configuration data to implement a user design in the FPGA. An FPGA may also include other programmable and non-programmable resources. As such, the circuits shown above in connection with FIGS. 1-2 may be implemented in a plurality of CLBs that perform equivalent logic operations of any one or more components of any one or more of the circuits of FIGS. 1-2. Thus, in one example the system 400 can be configured to generate the necessary configuration data/instructions to configure an FPGA to perform the various functions as disclosed above.

While the foregoing describes exemplary examples in accordance with one or more aspects of the present disclosure, other and further examples in accordance with the one or more aspects of the present disclosure may be devised without departing from the scope thereof, which is determined by the claims that follow and equivalents thereof. Claims listing steps do not imply any order of the steps. Trademarks are the property of their respective owners.

What is claimed is:

1. A method for using an input synchronous reset pulse, comprising:

capturing the input synchronous reset pulse for resetting a circuitry comprising a plurality of clock domains, wherein the input synchronous reset pulse is synchronized to a clock of a first clock domain of the plurality of clock domains;

holding the input synchronous reset pulse that is captured;

generating a reset pulse for the first clock domain;

transmitting the reset pulse that is generated to a logic in the first clock domain;

transmitting the reset pulse that is generated to a delay circuit that holds the reset pulse for a first number of cycles of the clock of the first clock domain;

monitoring for a rising edge of the reset pulse that has been held for the first number of cycles of the clock of the first domain;

indicating that the reset for the first clock domain is completed, when the rising edge of the reset pulse is detected;
transmitting the reset pulse that is generated to a synchronizer of a second clock domain;
synchronizing the reset pulse that is transmitted from the first clock domain to a clock of the second clock domain;
transmitting the reset pulse that is synchronized to the clock of the second clock domain to a logic in the second clock domain;
transmitting the reset pulse that is synchronized to the clock of the second clock domain to a delay circuit that holds the reset pulse for a second number of cycles of the clock of the second clock domain;
re-synchronizing the reset pulse that is synchronized to the clock of the second clock domain back to the clock of the first clock domain;
monitoring the reset pulse that is re-synchronized to the clock of the first clock domain for a rising edge;
indicating that a reset for the second clock domain is completed, when the rising edge is detected for the reset pulse that is re-synchronized to the clock of the first clock domain;
determining if a resetting of the circuitry is completed for all of the plurality of the clock domains; and
clearing the input synchronous reset pulse that was captured, when the resetting of the circuitry is completed for all of the plurality of the clock domains.

2. The method of claim 1, further comprising:
providing an informational output that indicates that a state machine is active and is processing data.

3. The method of claim 1, wherein the synchronous reset pulse is generated from an asynchronous reset pulse.

4. The method of claim 3, wherein the synchronous reset pulse is generated from the asynchronous reset pulse by capturing the asynchronous reset pulse and passing the asynchronous reset pulse through a synchronizer.

5. The method of claim 1, further comprising:
providing an indication in the first clock domain that indicates that a reset is in progress for the first clock domain.

6. The method of claim 1, wherein a value of the first number of cycles is set to a minimum number of cycles of the first clock that the reset signal is guaranteed to be held before being cleared.

7. The method of claim 1, further comprising:
providing an indication in the second clock domain that indicates that a reset is in progress for the second clock domain.

8. The method of claim 1, wherein the value of the second number of cycles is set to a minimum number of cycles of the second clock that the reset signal is guaranteed to be held before being cleared.

9. The method of claim 1, further comprising:
transmitting the reset pulse that is re-synchronized to the clock of the first clock domain to a delay circuit.

10. A non-transitory computer-readable medium storing a plurality of instructions which, when executed by a processor, cause the processor to perform operations for using an input synchronous reset pulse, comprising:
capturing the input synchronous reset pulse for resetting a circuitry comprising a plurality of clock domains, wherein the input synchronous reset pulse is synchronized to a clock of a first clock domain of the plurality of clock domains;
holding the input synchronous reset pulse that is captured;
generating a reset pulse for the first clock domain;
transmitting the reset pulse that is generated to a logic in the first clock domain;
transmitting the reset pulse that is generated to a delay circuit that holds the reset pulse for a first number of cycles of the clock of the first clock domain;
monitoring for a rising edge of the reset pulse that has been held for the first number of cycles of the clock of the first domain;
indicating that the reset for the first clock domain is completed, when the rising edge of the reset pulse is detected;
transmitting the reset pulse that is generated to a synchronizer of a second clock domain;
synchronizing the reset pulse that is transmitted from the first clock domain to a clock of the second clock domain;
transmitting the reset pulse that is synchronized to the clock of the second clock domain to a logic in the second clock domain;
transmitting the reset pulse that is synchronized to the clock of the second clock domain to a delay circuit that holds the reset pulse for a second number of cycles of the clock of the second clock domain;
re-synchronizing the reset pulse that is synchronized to the clock of the second clock domain back to the clock of the first clock domain;
monitoring the reset pulse that is re-synchronized to the clock of the first clock domain for a rising edge;
indicating that a reset for the second clock domain is completed, when the rising edge is detected for the reset pulse that is re-synchronized to the clock of the first clock domain;
determining if a resetting of the circuitry is completed for all of the plurality of the clock domains; and
clearing the input synchronous reset pulse that was captured, when the resetting of the circuitry is completed for all of the plurality of the clock domains.

11. The non-transitory computer-readable medium of claim 10, further comprising:
providing an informational output that indicates that a state machine is active and is processing data.

12. The non-transitory computer-readable medium of claim 10, wherein the synchronous reset pulse is generated from an asynchronous reset pulse.

13. The non-transitory computer-readable medium of claim 12, wherein the synchronous reset pulse is generated from the asynchronous reset pulse by capturing the asynchronous reset pulse and passing the asynchronous reset pulse through a synchronizer.

14. The non-transitory computer-readable medium of claim 10, further comprising:
providing an indication in the first clock domain that indicates that a reset is in progress for the first clock domain.

15. The non-transitory computer-readable medium of claim 10, wherein a value of the first number of cycles is set to a minimum number of cycles of the first clock that the reset signal is guaranteed to be held before being cleared.

16. The non-transitory computer-readable medium of claim 10, further comprising:
providing an indication in the second clock domain that indicates that a reset is in progress for the second clock domain.

17. The non-transitory computer-readable medium of claim 10, wherein the value of the second number of cycles is set to a minimum number of cycles of the second clock that the reset signal is guaranteed to be held before being cleared.

18. The non-transitory computer-readable medium of claim 10, further comprising:

transmitting the reset pulse that is re-synchronized to the clock of the first clock domain to a delay circuit.

19. An integrated circuit, comprising:
a signal capturing module for capturing a synchronous reset pulse for resetting a circuitry comprising a plurality of clock domains, wherein the synchronous reset pulse is synchronized to a clock of a first clock domain of the plurality of clock domains, and for generating a reset pulse for the first clock domain to be transmitted to a logic in the first clock domain and to a delay circuit that holds the reset pulse for a first number of cycles of the clock of the first clock domain;
a first monitoring module for monitoring a rising edge of the reset pulse that has been held for the first number of cycles of the clock of the first domain, and for indicating that the reset for the first clock domain is completed, when the rising edge of the reset pulse is detected;
a first synchronizer for synchronizing the reset pulse that is transmitted from the first clock domain to a clock of the second clock domain, wherein the reset pulse that is synchronized to the clock of the second clock domain is transmitted to a logic in the second clock domain and to a delay circuit that holds the reset pulse for a second number of cycles of the clock of the second clock domain;
a second synchronizer for re-synchronizing the reset pulse that is synchronized to the clock of the second clock domain back to the clock of the first clock domain;
a second monitoring module for monitoring the reset pulse that is re-synchronized to the clock of the first clock domain for a rising edge, and for indicating that a reset for the second clock domain is completed, when the rising edge is detected for the reset pulse that is re-synchronized to the clock of the first clock domain; and
a logic gate for determining if a resetting of the circuitry is completed for all of the plurality of the clock domains.

20. The integrated circuit of claim 19, wherein the input synchronous reset pulse is generated from an asynchronous reset synchronizer and clock gating module.

\* \* \* \* \*